United States Patent
Goldmann (10) Patent No.: US 8,618,727 B2
(45) Date of Patent: Dec. 31, 2013

(54) TRANSPARENT ORGANIC LIGHT EMITTING DIODE

(75) Inventor: Claudia Michaela Goldmann, Kreuzau (DE)

(73) Assignee: Koninklijke Philips N.V., Eindhoven (NL)

(*) Notice: Subject to any disclaimer, the term of this patent is extended or adjusted under 35 U.S.C. 154(b) by 136 days.

(21) Appl. No.: 13/139,742

(22) PCT Filed: Dec. 11, 2009

(86) PCT No.: PCT/IB2009/055703
§ 371 (c)(1),
(2), (4) Date: Sep. 6, 2011

(87) PCT Pub. No.: WO2010/070563
PCT Pub. Date: Jun. 24, 2010

(65) Prior Publication Data
US 2011/0303906 A1    Dec. 15, 2011

(30) Foreign Application Priority Data

Dec. 19, 2008    (EP) ..................... 08172226

(51) Int. Cl.
*H01L 51/00* (2006.01)
(52) U.S. Cl.
USPC .......................... 313/503; 313/512
(58) Field of Classification Search
USPC ................................. 313/498–512
See application file for complete search history.

(56) References Cited

U.S. PATENT DOCUMENTS

| 6,424,093 | B1 | 7/2002 | Mir et al. |
|---|---|---|---|
| 6,436,222 | B1 | 8/2002 | Andre et al. |
| 6,476,550 | B1 | 11/2002 | Oda et al. |
| 2002/0013013 | A1 | 1/2002 | Victor et al. |
| 2004/0042199 | A1 | 3/2004 | Cok |
| 2004/0119028 | A1 | 6/2004 | McCormick et al. |
| 2004/0160175 | A1* | 8/2004 | Yi .................. 313/506 |
| 2005/0040753 | A1* | 2/2005 | Osame et al. ............ 313/500 |
| 2006/0006795 | A1 | 1/2006 | Strip |
| 2008/0100211 | A1 | 5/2008 | Klein et al. |

FOREIGN PATENT DOCUMENTS

| DE | 10353992 A1 | 6/2005 |
|---|---|---|
| WO | 2010046833 A1 | 4/2010 |

* cited by examiner

*Primary Examiner* — Anne Hines
(74) *Attorney, Agent, or Firm* — David Zivan; Mark Beloborodov (57) ABSTRACT

The invention relates to a transparent organic light emitting diode (OLED) (1), comprising: a substrate material (2) with a top face (2a) and a bottom face (2b), whereas at least on the top face (2a) is arranged at least one OLED-layer system with a first electrode layer (3), a second electrode layer (4) and an organic light emitting layer system (5), arranged in between said first electrode layer (3) and said second electrode layer (4), whereas said OLED (1) is performed to emit light via the top face (2a) and via the bottom face (2b) and whereas the top face (2a) and the bottom face (2b) of said OLED (1) feature at least one bright lucent area (6) and at least one dark lucent area (7). The invention discloses that at least one layer on the top face (2a) features a varying relation between transparency and reflectivity in the lateral extension of the OLED (1) in such a way, that the OLED (1) features at least one bright lucent area (6) and at least one dark lucent area (7) at the top face (2a) and at the bottom face (2b), whereas said bright lucent areas (6) are arranged opposite to said dark lucent areas (7).

14 Claims, 5 Drawing Sheets

TRANSPARENT ORGANIC LIGHT EMITTING DIODE

FILED OF THE INVENTION

The invention relates to a transparent organic light emitting diode (OLED) comprising bright and dark lucent areas.

BACKGROUND OF THE INVENTION

The present invention relates to a transparent organic light emitting diode (OLED), comprising a substrate material with a top face and a bottom face, whereas at least on the top face is arranged at least one OLED-layer system with an anode layer, a cathode layer and an organic light emitting layer system, arranged in between said anode layer and said cathode layer. Said OLED is performed to emit light via the top face and via the bottom face, whereas the top face and the bottom face of said OLED feature at least one bright lucent area and at least one dark lucent area.

The US 2008/0100211 A1 discloses an organic light emitting diode with an organic light emitting layer located between a transparent electrode and one further electrode on a substrate. At least one of the electrodes features two layers. These two layers include a structured layer, which is a charge carrier injection layer, and a conductive second layer into which the first layer is embedded. In some embodiments the organic light emitting embedded layer includes a structured carrier blocking layer. Unfortunately this system of structuring the light emitting area of an OLED is basically influencing the organic light emitting layer system, whereas the efficiency decreases with increasing the portion of embedding a first layer into the second layer, building the transparent electrode. The embedding is for the purpose, that the second layer can be deposited onto the substrate, and the first layer can be created by structured doping in the second layer. The doping can result in an easier injection of charge carriers into the organic light emitting layer or can even allow the injection of charge carriers into the organic light-emitting layer, whereas the injection would not occur with the second layer alone. In this way the organic light emitting diode can only emit light efficiently in the areas structured by the first layer.

SUMMARY OF THE INVENTION

Thus, the invention has the objective to eliminate the above mentioned disadvantages. In particular it is an objective of the present invention to provide a transparent organic light emitting diode (OLED), which can emit light via the top face and via the bottom face and is arranged to laterally vary the intensity emitted to either side which can be implemented nearly without decreasing the efficiency of emitting light.

This objective is achieved by a transparent organic light emitting diode (OLED) as taught by claim 1 of the present invention. Preferred embodiments of the invention are defined by the sub claims.

The invention discloses, that at least one layer on the top face features a varying relation between transparency and reflectivity in the lateral extension of the OLED in such a way, that the OLED features at least one bright lucent area and at least one dark lucent area at the top face and at the bottom face, whereas said bright lucent areas are arranged opposite to said dark lucent areas.

According to the invention the OLED features a varying relation between transparency and reflectivity in its lateral extension. The varying relation between said transparency and said reflectivity is applied to at least one layer on the top face. When a current is applied between said anode and said cathode, the organic light emitting layer emits light. The light emits towards the anode layer and towards the cathode layer. According to the invention, at least one of the layers on the top face of the OLED, e.g. the cathode layer, features a variable relation between transparency and reflectivity in the lateral extension of the OLED. In its result, a OLED is created, which can feature a structuring on both sides, which appears in bright lucent and dark lucent discrete areas, whereas the structuring is inverted in the brightness and mirror inverted related to the side face and the second side face of the entire OLED.

As a preferred embodiment on the OLED-layer system is arranged at least one antireflection layer. In the following, it will be assumed without loss of generality that the electrode layer on the top face of the OLED is the cathode layer. This cathode may either be a single layer or a multilayer system. In this preferred embodiment, the varying relation between transparency and reflectivity can be realized in the cathode layer and/or in the antireflection layer. The varying of the relation between the transparency and reflectivity may be caused by a varying in the thickness of the cathode layer across the lateral extension of the OLED, whereas e.g. a high thickness of a metal cathode causes an increased reflectivity towards the organic light emitting layer system. Moreover a varying in the thickness of the antireflection layer across the lateral extension of the OLED, whereas e.g. an increase in thickness of the antireflection coating from 0 to a finite value causes a decreased reflectivity towards the organic light emitting layer system. Furthermore a local deposition of an material or additional materials between inside the cathode layer or between the cathode layer and the antireflection coating or a local deposition of an material or additional materials on top of or underneath or inside the antireflection coating or a local replacement of the original cathode layer by a different conductive or nonconductive material or a local replacement of the original antireflection layer by a different material or any combination of the above can vary the relation between transparency and reflectivity.

E.g., if a transparent silver cathode is locally replaced by ITO, the reflectivity will typically be decreased in the ITO areas, and a larger amount of light will be emitted through the OLED's top side. Preferably, the electron injection properties of the replaced areas (e.g. ITO) should not be worse than in the original cathode areas; in this way reductions of the total OLED efficiency can be avoided. Therefore, the preferred solution may be to reduce the original cathode locally to a minimum thickness required for carrier injection, and to deposit a different conductive material (e.g. ITO) on top of these areas of minimum thickness.

For example, according to another preferred embodiment, the cathode layer can feature areas with a low thickness and areas with a high thickness, whereas said low thickness areas are filled up with a filler material. Onto the cathode layer with the filler material the antireflection layer can be applied. The areas in which said filler material is applied and in which the cathode layer features a lower thickness, the reflectivity of the cathode layer is increased or decreased. In the case of decreased reflectivity, less light can pass the bottom face of the OLED, and a higher amount of light can emit via the top side of the OLED.

According to yet another embodiment the cathode layer can feature a high thickness, whereas in the areas of high thickness an additional applied material can be deposited on the cathode layer. According to this embodiment the reflectivity of the cathode layer, and the additional applied material, respectively, is increased or decreased. In the case of an increased reflectivity, only a reduced amount of light can pass the cathode layer in these areas, and due to the high reflectivity the light passes the bottom face of the OLED.

According to yet another embodiment the thickness of the cathode layer is constant in lateral direction of the OLED, and the thickness of the antireflection layer is varying. A higher thickness of the antireflection layer leads to a changed reflectivity, which can lead to a lower or higher amount of light of a given wavelength passing the antireflection layer in the area of high thickness, and an increased or decreased portion of light passing the OLED via the bottom face.

In the scope of the present invention the varying relation between transparency and reflectivity is not limited to the cathode layer and/or the antireflection layer. As well as a varying of thickness in the cathode layer and/or the antireflection layer the thickness of the anode layer can be performed in a variable way, whereas discrete areas of varying said thickness can be performed in certain patterns.

According to every embodiment, the amount of intensity of light, emitted via said top face and emitted via said bottom face, can be approximately constant at any discrete area across the entire OLED. When the amount of light, emitted via the top side, is added to the amount of light, emitted via said bottom face, the total amount can be approximately constant at any discrete area within the entire OLED. Thus, the higher the amount of light, passing across a first face of the OLED, the lower is the amount of light passing the opposite face of the OLED. This inventive system within the OLED leads to the advantage, that the efficiency of the OLED is not necessarily decreased, because the OLED emits light across every discrete area within the entire field of light emission. We note, however, that absorbing materials can also be used, e.g. for the local replacement of the antireflection layer. In this way, the local replacements will be visible e.g. as a dark pattern in the emission to the OLED's top side and can be visible as a bright pattern in the emission to the OLED's bottom side, while the total emission efficiency of the OLED has been reduced.

According to yet another embodiment the relation between transparency and reflectivity of the cathode layer and/or of the antireflection layer or of the anode layer in the lateral extension of the OLED is defined in discrete, separated areas or the relation features at least one continuously transition. The continuously transition can be performed by a pattern of a varying density of dark lucent and bright lucent areas. One possibility to perform a varying density can be obtained by a varying location of thick and thin areas, whereas a high density of thick areas can lead to a lower amount of light via a first face and a higher amount of light via the opposite face of the OLED.

The varying relation in transparency and reflectivity of the OLED caused by the above described means can lead to different optical appearances of the created patterns.

For example, if the reflectivity is thus uniformly increased over the entire visible spectrum and the transparency decreased accordingly, the result will be a straightforward bright-dark contrast. I.e. the spectrum of emitted light is essentially identical in the dark and the bright regions on each side of the OLED, while its intensity is varied.

If e.g. the reflectivity is nonuniformly increased over the visible spectrum and the transparency nonuniformly decreased accordingly—e.g. by varying the thickness of the antireflection layer—, which means that the varying relation between transparency and reflectivity in the lateral extension of the OLED is performed depending on the wavelength emitted by the organic light emitting layer system, this leads to different wavelength spectra in the dark regions compared to the bright regions on each face of the OLED: A first part of the wavelength spectrum is reflecting in the unpatterned areas (and a corresponding part of the spectrum is transmitted), whereby a different second part of the spectrum is reflecting in the patterned areas (and a corresponding different part of the spectrum is transmitted).

If e.g. the absorption is nonuniformly increased over the visible spectrum and the transparency or reflectivity changed accordingly—for example by inserting an absorbing material locally underneath the antireflection layer—, this leads to different wavelength spectra in the dark regions compared to the bright regions on each face of the OLED: A first part of the wavelength spectrum is transmitted in the unpatterned areas (and a corresponding part of the spectrum is reflecting), whereby a different second part of the spectrum is transmitted in the patterned areas.

The distribution of bright lucent areas and dark lucent areas in the lateral extension of the OLED results in decorative graphics and/or information graphics like discrete signs and/or letters, any motive or patterns.

Thus the created pattern can also be visible when the OLED is switched off, e.g. in a brightness contrast or color contrast compared to the unpatterned areas.

With respect to the desired magnitude of the contrast in color or brightness of these patterns, and the necessary degree of variation of the relation in transparency and reflectivity, the physiological sensibility of human eyes relating to the emitted wavelength has to be taken into account.

The layer system, which is for example directly applied on the substrate material, may comprise the following materials: said anode layer can be performed as an ITO-layer (I=Indium, T=Tin, O=Oxide), whereas the substrate material can be performed e.g. as a glass material or a foil and the ITO-layer is designed as a coating layer on said substrate material. The organic light emitting layer system may comprise a p-doped hole injection layer MTDATA:$F_4$TCNQ (1%) 40 nm. Next to the p-doped hole injection layer a hole carrier layer can be applied ($\alpha$-NPD, 10 nm). Next to this layer an emission layer is applied, whereas the emission layer can be performed in different colors. E. g. orange: $\alpha$-NPD: Ir(MDQ)$_2$(acac) (10%), 20 nm. The next layer can be an electron transport layer (BAlq 20 nm), which is followed by an n-doped layer (LiF 1 nm). Next to the organic light emitting layer system the cathode layer system can be a Al-layer with a thickness of 1.5 nm and on the Al-layer a transparent Ag-layer of 15 nm is applied. On said transparent thin Ag-layer an Al-layer of 50 nm can be applied in discrete areas to perform the pattern in the OLED. As a next layer an antireflection layer can be applied, e.g. Alq$_3$ (50 nm). In order to cover said layers, on or over the final layers is applied a transparent cover element and/or a transparent cover layer for protecting said OLED-layer system against damage and/or moisture.

In order to vary the relation between reflectivity and transparency, the following materials can be applied for the cathode and/or the antireflection layer, respectively said filler material or the additional applied material: Metal materials, aluminium, silver, gold, copper, nickel and so on. Moreover inorganic materials like ZnS or ZnSe are applicable. Organic materials like Alq$_3$, $\alpha$-NPD, Spiro-compounds, phthalocyanines, fullerences, etc. are applicable.

When organic materials such as Alq$_3$ or $\alpha$-NPD are used as an antireflection material, the transparency of the entire OLED can be varied within about 20% absolute by applying an improved antireflection coating in local areas. Thus a portion in the range of about 10% absolute of the emitted light can be reallocated from the anode side to the cathode side. Due to the limited ability of human eyes to observe differences in the brightness of light this may represent the minimum of a desirable contrast in said brightness.

The structuring of the transparency varying layers can be performed by using a mask technology. E. g. a shadow mask-principle is applicable, whereas when a printing-principle is applicable (e.g. ink-jet printing, or any other printing technique), the structuring can be performed by said printing.

Said transparent cover element for protecting the layer system can be performed as a glass cover, which is glued onto the layer system of the OLED. Furthermore, a frame can be applied by gluing, whereas in or on top of the frame is arranged a glass panel as a translucent part. Next to the frame carrying the glass panel, a glass panel can directly be glued onto the OLED.

When the protection system is performed as a transparent cover layer, the cover layer can be performed as one or more double layers of SiN (200 nm)/SiO$_2$ (100 nm), or as any other thin-film encapsulation. According to yet another embodiment, said transparent cover layer can be applied combined with a transparent cover element like a glass panel.

The field of application of the present OLED can relate to illumination and/or decorative purposes. For instance, the present OLED can be used as room dividing element, performed as a self illuminating element emitting light via the first face as well as via the second face. The dark lucent areas as well as the bright lucent areas can lead to any various images like pictures, graphics, signs like arrows or signs like a moon, star, geometrical, figures and so on. This room dividing element could be patterned with a picture or sign referring to the use of the respective room (e.g. waves for a hotel located at the sea, etc.). The OLED may also be mounted in a frame that allows for rotation of the OLED, which could in this case be used for interior lighting and decorative purposes in general. Another application can be seen in OLEDs which are performed as lamp shades. The lamp shade can be preferably arranged on ceilings of rooms when hung from the ceiling, and emit a light downwards via the bottom face and upwards via the top face. Furthermore, the OLEDs may be used as OLED windows e.g. in buildings or in cars (in the latter case e.g. the logo of the car maker could be patterned onto the OLED).

Additional details, characteristics and advantages of the objective of the present invention are disclosed in the depending claims and the following description of the respective figures, which show preferred embodiments of the invention and which will be described in conjunction with the accompanying figures, in which

DESCRIPTION OF EMBODIMENTS

The FIGS. 1 to 7 show different embodiments of a transparent organic light emitting diode (OLED) 1. The OLEDs 1 feature a substrate material 2, which is intended to provide a carrier material. The substrate may comprise further layers, e.g. for optical purposes like light out-coupling enhancement or other purposes. Said substrate material 2 features a top face 2a in an upward direction and a bottom face 2b in a downward direction. On the top face 2a of the substrate material 2 is applied a plurality of a different layers, which are described as following. Next to the top face 2a is applied a first electrode layer 3, e.g. an anode layer, which can be performed as an ITO-layer. On the first electrode layer 3 is applied an organic light emitting layer system 5, which can be performed as a multilayer system, whereas on the organic light emitting layer system 5 is applied a second electrode layer 4, e.g. a cathode layer, which can be e.g. a Al-layer or a Ag-layer or a ITO-layer or a ZnO-layer. By applying a current between the first electrode layer 3 and the second electrode layer 4 the organic light emitting layer system 5 can emit light both into the upward direction and into the downward direction. The applicable current is indicated by a battery 14, assuming without loss of generality that the first electrode layer is the anode layer and the second electrode layer is the cathode layer. Finally, onto the second electrode layer 4 is applied an antireflection layer 8, which can be either a single layer or a multilayer system.

The OLED 1 is performed as a dual OLED 1, which is suited to emit light via the top face 2a and via the bottom face 2b. The emitted light can be divided in at least two lucent areas, namely bright lucent areas 6 and dark lucent areas 7. According to the present embodiments the bright lucent areas 6 and the dark lucent areas 7 are arranged alternating to each other. According to any other embodiment the arrangement of the bright and dark lucent areas 6 and 7 may feature any formation to each other, and the arrangement is not limited to the present alternating embodiment. The bright lucent areas 6 are characterized by a bright emission of light B and the dark lucent areas 7 are characterized by dark emission of light D. The embodiments of said OLEDs 1 are characterized in that at least one layer of the top face 2a features a varying relation between transparency and reflectivity in the lateral extension of the OLED 1. The varying relation between transparency and reflectivity leads to said bright lucent areas 6 and dark lucent areas 7.

In the following we assume without loss of generality that the first electrode layer 3 is the anode layer and the second electrode layer 4 is the cathode layer.

Figure 1:
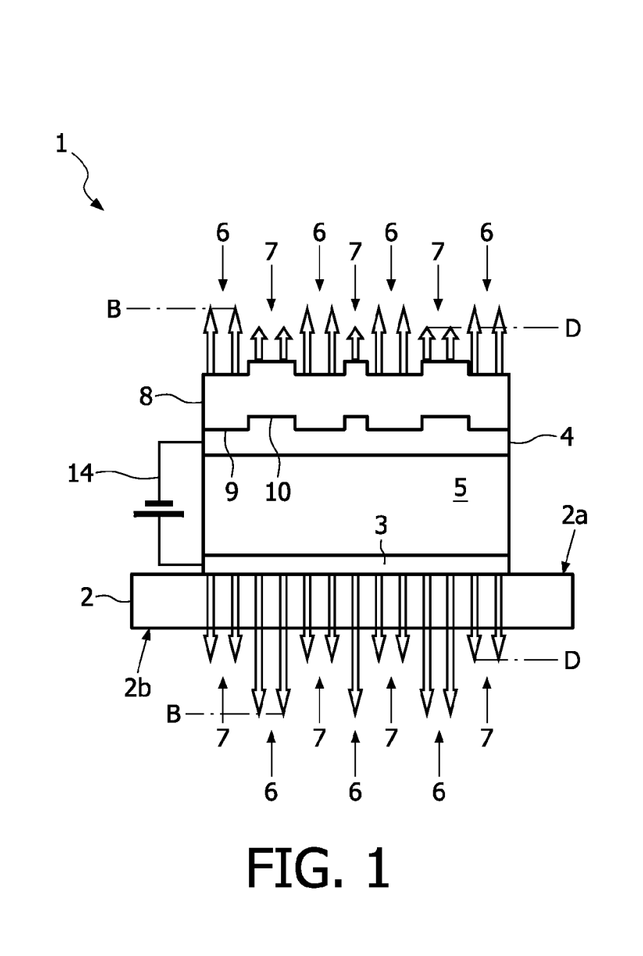
FIG. 1 shows a first embodiment of the present OLED in a cross sectional view, whereas the cathode layer features a varying thickness.

FIG. 1 shows a first embodiment of generating a varying relation between transparency and reflectivity by varying the thickness of the cathode layer 4. Said cathode layer 4 features areas with a low thickness 9 and a high thickness 10. The varying thickness of the cathode layer 4 is continued in the antireflection layer 8, but the thickness of said antireflection layer 8 is constant across the entire OLED 1. Due to an increased thickness of the cathode layer 4 in the high thickness areas 10 e.g. the reflectivity of the cathode layer 4 is increased for a given wavelength or the entire spectrum e.g. and the transparency decreased. Thus, the amount of the light, emitted via the bottom face 2b of the substrate material 2 is increased for the given wavelength or the entire spectrum and the amount of light, emitted via the top side of the OLED is decreased.

In the low thickness areas 9 of the cathode layer 4, e.g. the reflectivity is decreased for a given wavelength or the entire spectrum, e.g. and the transparency increased. Accordingly, the amount of light, emitted via the top side is increased and the amount of light, emitted via the bottom face 2b is decreased compared to the cathode areas of high thickness. Thus, bright lucent areas 6 are separated from the dark lucent areas 7. However, the total amount of light, emitted via said top side and emitted via said bottom face 2b can be approximately constant at any discrete area across the OLED 1.

Figure 2:
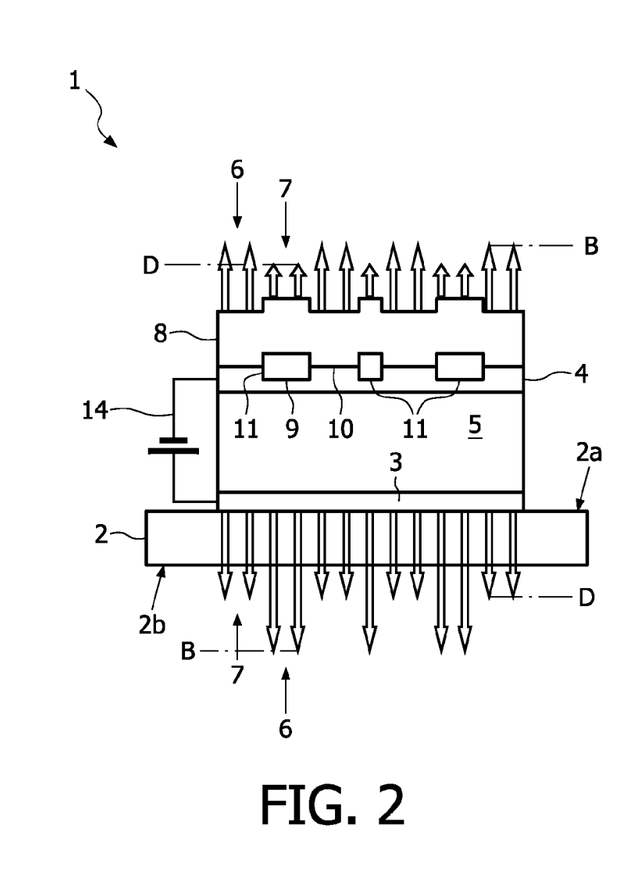
FIG. 2 shows a second embodiment of the present OLED in a cross sectional view, whereas the cathode layer features a varying thickness and the areas with low thickness are filled up with a filler material.

FIG. 2 shows a next embodiment of an OLED 1 with a varying thickness in the cathode layer 4. Thus, the cathode layer 4 is divided into low thickness areas 9 and high thickness areas 10. Within the cavities, generated by the low thickness areas 9 is arranged a filler material 11. By applying the filler material 11, the low thickness areas 9 lead to a change in reflection within the cathode layer 4, and in combination with the filler material 11 e.g. the reflectivity is e.g. increased for a given wavelength or the entire spectrum and e.g. the transparency decreased compared to the high thickness areas 10. Thus, in the areas with the applied filler material 11 the emission of light leads to dark lucent areas 7 for a given wavelength or the entire spectrum in the light emitted via the top side. On the other hand the light emitted via the bottom face 2b features bright lucent areas for a given wavelength or the entire spectrum, where the filler material 11 is applied.

Figure 3:
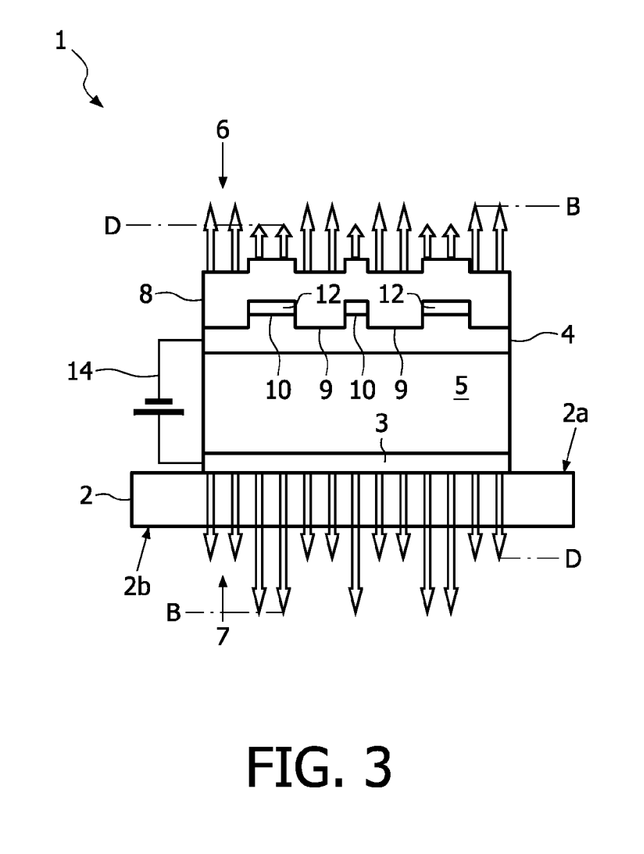
FIG. 3 shows a third embodiment of the present OLED in a cross sectional view, whereas the cathode layer features a varying thickness and on the areas with high thickness of the cathode layer is arranged an additional applied material.

FIG. 3 shows a next embodiment of generating bright lucent areas 6 and dark lucent areas 7. According to this embodiment said cathode 4 features low thickness areas 9 and high thickness areas 10 again. E.g. in order to intensify the effect of increasing or decreasing the reflectivity, on the high thickness areas 10 is applied an additional material 12. This leads to the generation of bright and dark lucent areas 6 and 7, whereas e.g. the dark emission D is induced via the top side in the areas of the additional applied material 12. Between the areas of additional material 12 is shown a bright emission B via the top face 2a. The bright and dark emission B and D is inverted in the emission of light via the bottom face 2b: Areas that show bright emission to the top face 2a show dark emission to the bottom face 2b, and areas that show dark emission to the top face 2a show bright emission to the bottom face 2b.

Figure 4:
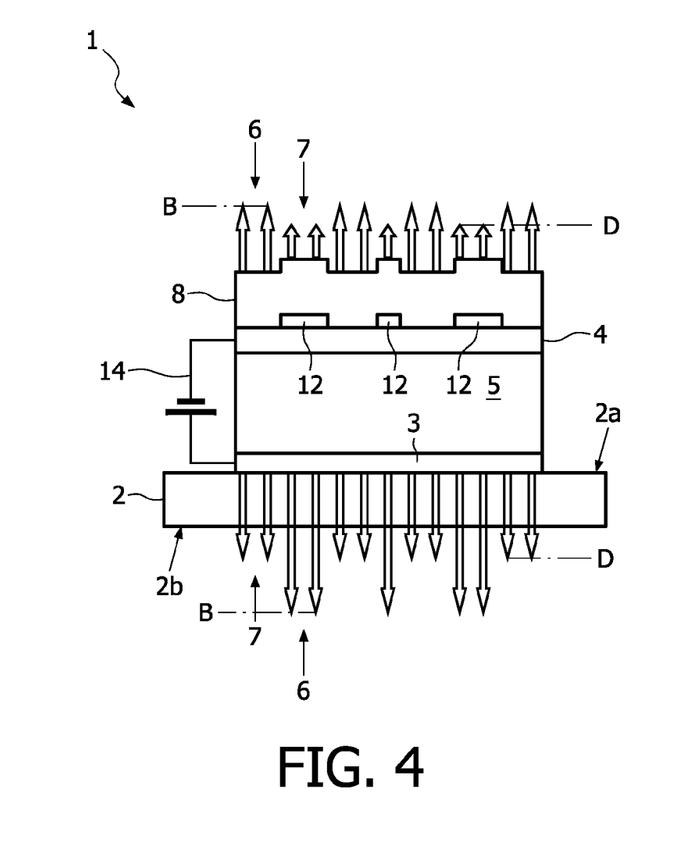
FIG. 4 shows a fourth embodiment of the present OLED in a cross sectional view, whereas the cathode layer features a constant thickness, but on the cathode layer is arranged another additional applied material.

FIG. 4 shows a next embodiment of generating bright lucent areas 6 and dark lucent areas 7. According to this embodiment the cathode layer 4 features a homogeneous thickness across the entire OLED 1. In order to generate e.g. dark lucent areas 7 in the light emitted via the top side, an additional material 12 is applied on the cathode layer 4. The varying relation between transparency and reflectivity is led back to the presence of the additional material 12. Thus, e.g. the dark lucent areas of the light, emitted via said top side, are limited to the areas in which the additional applied material 12 is deposited on the cathode layer 4, whereas the bright lucent areas of the light, emitted via said top side, are limited to the areas in which no additional material is deposited on the cathode layer 4.

Figure 5:
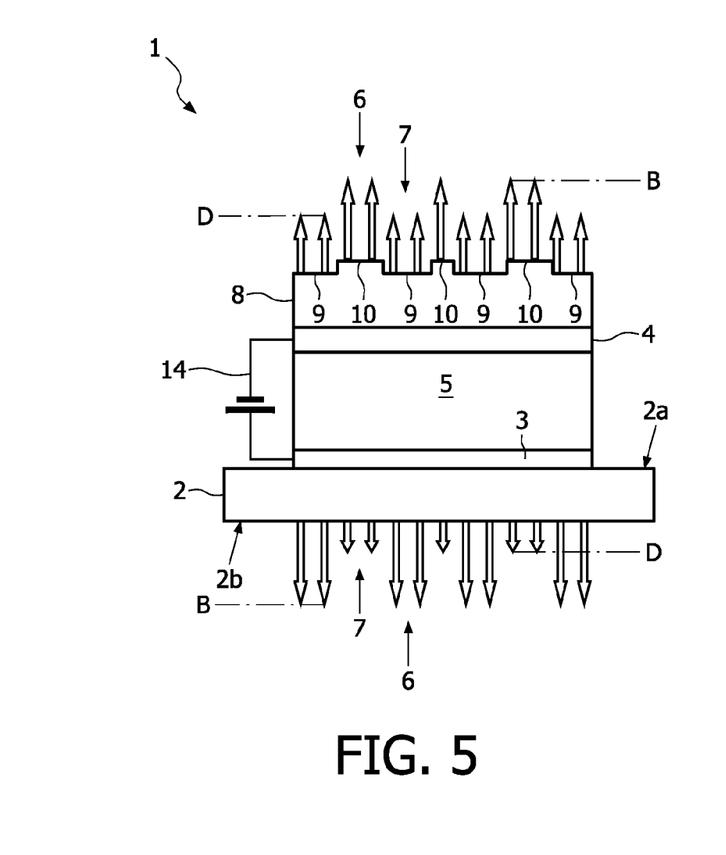
FIG. 5 shows a fifth embodiment of the present OLED in a cross sectional view, whereas the cathode layer features a constant thickness and whereas an antireflection layer is applied on the cathode layer with a varying thickness.

FIG. 5 shows a next embodiment to generate bright lucent areas and dark lucent areas 6 and 7 within the emitting faces. The varying relation between transparency and reflectivity is caused by a varying thickness within the antireflection layer 8. The higher thickness of the antireflection layer 8 can e.g. lead to a lower reflectivity. Thus, the light, generated within the layer system 5 and directed to the top direction towards the antireflection layer 8, is reflected less than in the areas of the antireflection layer 8 with a lower thickness.

Figure 6:
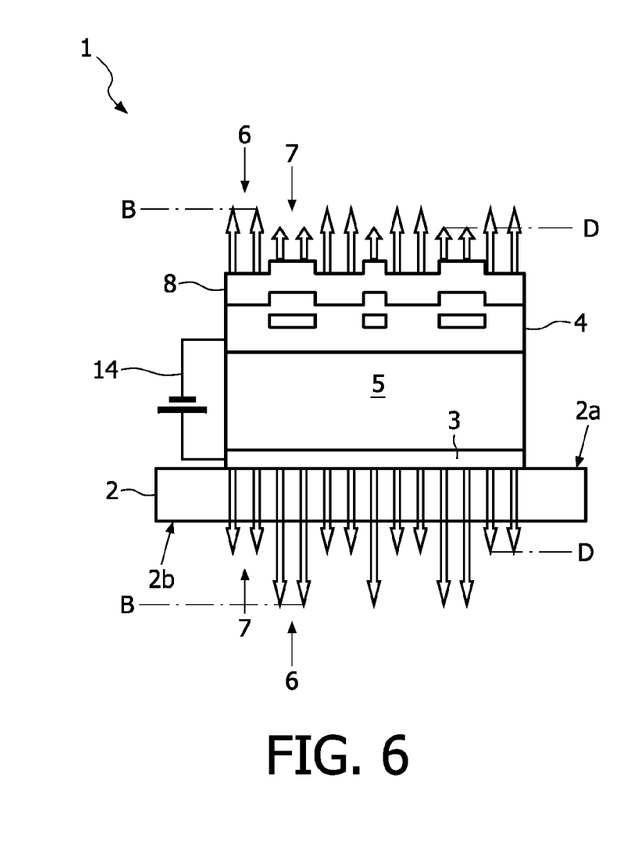
FIG. 6 shows a sixth embodiment of the present OLED in a cross sectional view, whereas inside the cathode layer a different material is inserted locally and whereas the antireflection layer features a constant thickness.

FIG. 6 shows a next embodiment of generating bright lucent areas 6 and dark lucent areas 7. According to this embodiment an additional material 12 is locally inserted inside the cathode layer. This leads e.g. to an increased reflectivity e.g. and decreased transparency in the areas of the additional applied material and thus to the generation of bright and dark lucent areas 6 and 7, whereas e.g. the dark emission D is induced via the top side in the areas of the additional applied material 12.

Figure 7:
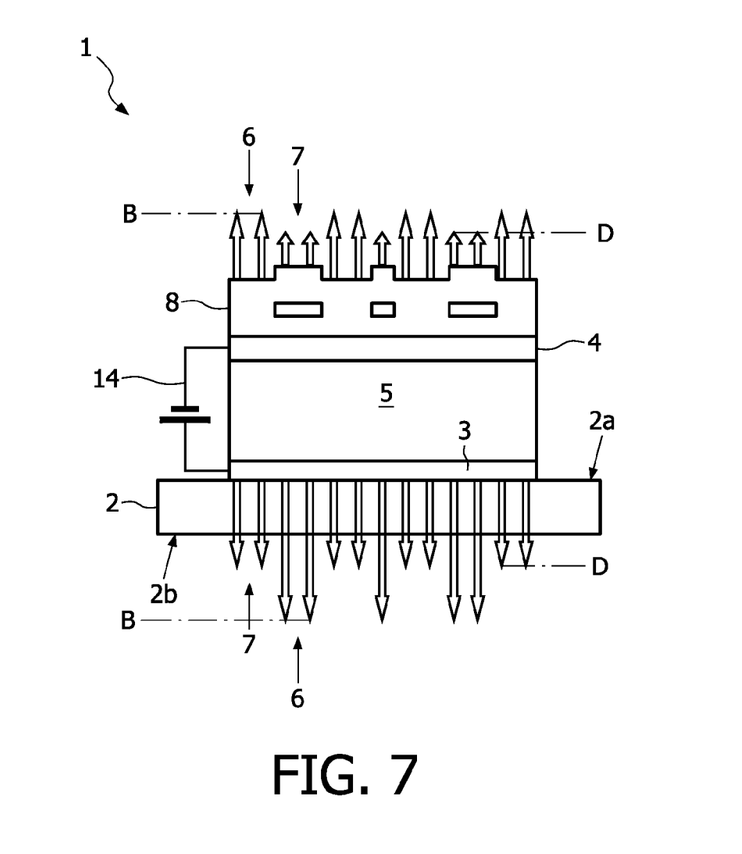
FIG. 7 shows a seventh embodiment of the present OLED in a cross sectional view, whereas the cathode layer features a constant thickness and whereas a different material is inserted locally inside the antireflection layer.

FIG. 7 shows a next embodiment of generating bright lucent areas 6 and dark lucent areas 7. According to this embodiment an additional material 12 is locally inserted inside the antireflection layer. This leads e.g. to an increased reflectivity e.g. and a decreased transparency in the areas of the additional applied material and thus to the generation of bright and dark lucent areas 6 and 7, whereas e.g. the dark emission D is induced via the top side in the areas of the additional applied material 12.

Figure 8:
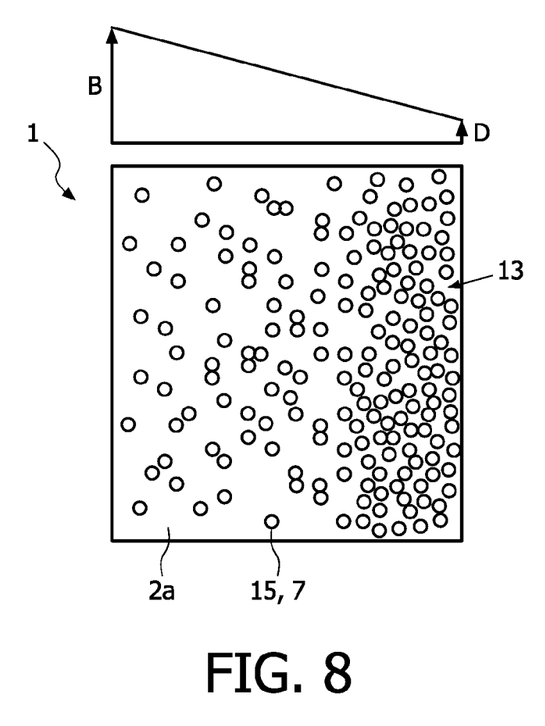
FIG. 8 shows an embodiment of an OLED with a continuous transition in the brightness of said emitted light.

FIG. 8 shows an embodiment of the OLED 1 featuring a continuously transition between an area with the relation between transparency and reflectivity, featuring a high transparency and an area with the relation between transparency and reflectivity, featuring a low reflectivity. The continuously transition is performed by a pattern 13 of a varying intensity of dark and bright lucent areas. The pattern 13 is performed via a plurality of single areas, shown as circles 15, which feature a dark lucent area 7 each, e. g. due to a high thickness of the cathode layer or due to an increased or decreased thickness of the antireflection layer. Moreover the circles 15 can be performed by a filler material or an additional applied material. The more circles 15 are arranged within a certain area, the lower or higher is the light emission in the direction of the top side.

Figure 9A:
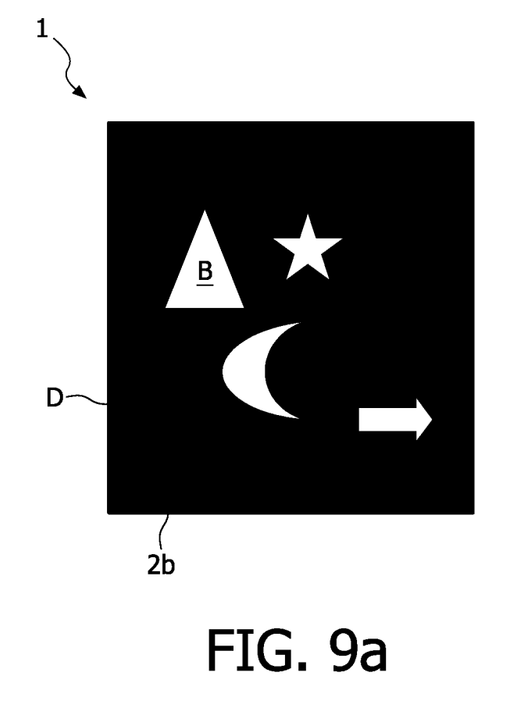
FIG. 9a shows an embodiment of graphics within the entire light emitting area of the OLED, whereas the OLED is shown from the top face
Figure 9B:
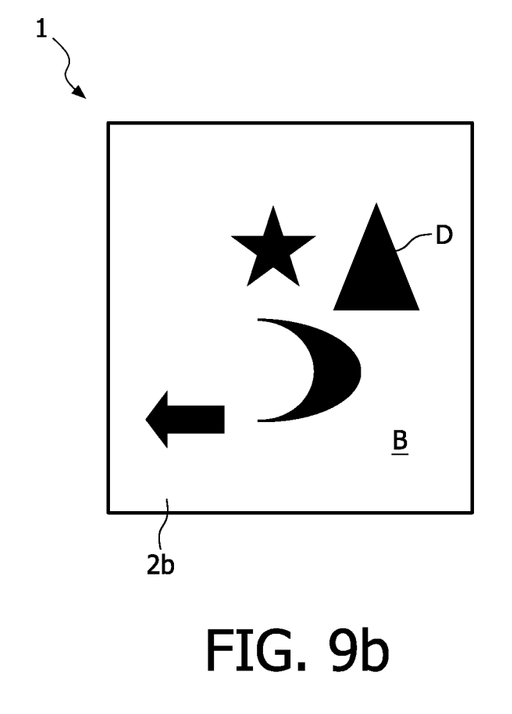
FIG. 9b shows an embodiment of graphics within the entire light emitting area of the OLED, whereas the OLED is shown from the bottom face.

FIGS. 9a and 9b show an embodiment of a OLED 1, whereas in FIG. 9a the OLED 1 is shown from the top face 2a and in FIG. 9b the OLED 1 is shown from the bottom face 2b. As an example only within the lateral extension of the OLED 1 are arranged several graphics. The distribution of the bright lucent areas and dark lucent areas 6 and 7 lead to a bright emission B and a dark emission D of light. By turning around the OLED 1 from the FIG. 7a to FIG. 7b the bright lucent areas and the dark lucent areas are inverted. The signs within the lateral extension of the OLED 1 shown in the FIG. 2a appear in a bright emitted light B, whereas the view of the top face 2b the signs appear in dark emission D.

The present invention is not limited by the embodiments described above, which are represented as examples only and can be modified in various ways within the scope of protection defined by the appending patent claims. Thus, the invention is also applicable to different embodiments in particular of the design of the OLED-layer system. On the substrate material 2 can be arranged several OLED-layer systems, which may emit different colors of light. The relation between transparency and reflectivity can be depending on the emitting wavelength of the layer system 5. Thus, the emitted light can appear in different colors between the top face 2a and the bottom face 2b. Furthermore, the dark lucent regions "D" may also be regions in which no light is emitted via the bottom side and/or the top side. It is also possible to pattern one OLED using several of the methods discussed above; i.e. for example pattern 1 is created in areas A1 on the OLED by thinning the cathode, and pattern 2 is created in areas A2 (not identical to A1) for example by varying the thickness of the antireflection coating, etc.

Furthermore, the antireflection layer may be deposited not directly on the OLED but may also be a standalone layer at a certain distance from the organic light emitting system with its electrodes.

LIST OF NUMERALS 1 organic light emitting diode (OLED)
2 substrate material
2a top face
2b bottom face
3 first electrode layer
4 second electrode layer
5 organic light emitting layer system
6 bright lucent area
7 dark lucent area
8 antireflection layer
9 low thickness area
10 high thickness area
11 filler material
12 additional applied material
13 pattern
14 battery
15 circle
B bright emission
D dark emission

The invention claimed is:

1. A transparent organic light emitting diode (OLED) device, comprising:
a first electrode layer;
second electrode layer; and
an organic light emitting layer arranged between said first electrode layer and said second electrode layer; and
at least one other layer on top of the second electrode layer, wherein said OLED is configured to emit light via a top surface of said OLED device and via a bottom surface of said OLED device, and
wherein at least one of the cathode layer or the at least one other layer is structured to have as varying transparency and reflectivity laterally across the organic light emitting layer such,
that the OLED device exhibits at least one first bright lucent area at the top surface and at least one first dark lucent area, at the top surface, that is darker than the at least one first bright lucent area and such that the OLED device exhibits, at the bottom surface, at least one second dark lucent area under the at least one first bright lucent area and exhibits, at the bottom surface, at least one second bright lucent area under the at least one first dark lucent area, wherein the at least one second bright lucent area is brighter than the at least one first dark lucent area and the at least one second dark lucent area.

2. The transparent OLED device according to claim 1, wherein the at least one other layer is at least one antireflection layer.

3. The transparent OLED device according to claim 2, wherein the antireflection layer includes laterally varying thickness across the organic light emitting layer, causing a varying ratio of reflectivity versus transparency in the antireflection layer.

4. The transparent OLED device according to claim 1, wherein the second electrode layer includes a laterally varying thickness across the organic light emitting layer, causing a varying ratio of reflectivity versus transparency in the second electrode layer.

5. The transparent OLED device according to claim 1, wherein an additional material is arranged inside the second electrode layer or between the second electrode layer and the at least one other layer.

6. The transparent OLED device according to claim 1, wherein an additional material is arranged on top of or inside the at least one other layer.

7. The transparent OLED device according to claim 1, wherein the second electrode layer includes areas with a low thickness and areas with a high thickness that is larger than the low thickness wherein said low thickness areas are filled up with a filler material.

8. The transparent OLED device according to claim 7, wherein an additional material is arranged on the areas of the second electrode layer with the high thickness.

9. The transparent OLED device according to claim 1, wherein a cumulative intensity of light, emitted via said top surface and emitted via said bottom surface is approximately constant at any discrete area across the OLED device.

10. The transparent OLED device according to claim 1, wherein a ratio of the transparency and the reflectivity transitions continuously across at least a portion of the organic light emitting layer.

11. The transparent OLED device according to claim 10, wherein said at least one first bright lucent area is a plurality of first bright lucent areas, wherein said at least one first dark lucent area is a plurality of first dark lucent areas, wherein said at least one second bright lucent area is a plurality of second bright lucent areas, wherein said at least one second dark lucent area is a plurality of second dark lucent areas, wherein said transition is performed by a pattern of a varying density of at least one of the first dark lucent areas and the first bright lucent areas or the second dark lucent areas and the second bright lucent areas.

12. The transparent OLED device according to claim 1, wherein each of said lucent areas form decorative graphics or information graphics.

13. The transparent OLED device according to claim 1, wherein the transparency and the reflectivity is dependent on the wavelength emitted by the organic light emitting layer such that different wavelength spectra are exhibited on said top and bottom surfaces.

14. The transparent OLED device according to claim 1, wherein at least one of a transparent cover element or transparent cover layer is disposed on the organic light emitting layer for protecting said organic light emitting layer against at least one of damage or moisture.

* * * * *